United States Patent [19]

Lando et al.

[11] Patent Number: 4,888,450

[45] Date of Patent: Dec. 19, 1989

[54] CIRCUIT BOARD FABRICATION LEADING TO INCREASED CAPACITY

[75] Inventors: David J. Lando, Allentown, Pa.; Frederick R. Wight, Jr., West Millington, N.J.

[73] Assignee: AT&T Bell Laboratories, Murray Hill, N.J.

[21] Appl. No.: 750,732

[22] Filed: Jun. 28, 1985

Related U.S. Application Data

[63] Continuation of Ser. No. 330,011, Dec. 11, 1981, abandoned.

[51] Int. Cl.⁴ .............................................. H05K 1/03
[52] U.S. Cl. ................................. 174/68.5; 430/313; 430/319
[58] Field of Search ........................................ 174/68.5

[56] References Cited

U.S. PATENT DOCUMENTS

| | | | |
|---|---|---|---|
| 3,649,274 | 3/1972 | Older et al. | 174/68.5 X |
| 3,922,479 | 11/1975 | Older et al. | 174/68.5 |
| 3,934,335 | 1/1976 | Nelson | 174/68.5 X |
| 4,211,560 | 7/1980 | Taguchi | 430/313 |
| 4,405,394 | 9/1983 | Cohen | 430/319 X |
| 4,411,980 | 10/1983 | Haney | 430/319 X |

Primary Examiner—R. R. Kucia
Attorney, Agent, or Firm—Bruce S. Schneider

[57] ABSTRACT

Printed circuit boards having a plurality of circuit layers are produced using a specific processing sequence. A copper-clad substrate is first patterned in a desired configuration to produce the first layer of the printed circuit board. The patterned metallization is then covered with a specifically formulated energy sensitive material. The energy sensitive material is delineated in a desired pattern and developed to uncover portions of the underlying metallization pattern. The entire substrate is blanket-cured to produce a rigid layer having openings in appropriate places. The openings are metallized and a second copper pattern is produced on the cured polymer by conventional metallization and lithographic techniques. If desired, the process is repeated until a suitable number of copper patterned levels are obtained.

13 Claims, 4 Drawing Sheets

CIRCUIT BOARD FABRICATION LEADING TO INCREASED CAPACITY

This application is a continuation of application Ser. No. 330,011 Filed Dec. 11, 1981, now abandoned.

BACKGROUND OF THE INVENTION

1. Field of the Invention

This invention relates to electronic circuitry and in particular to printed circuit board technology.

2. Art Background

The electrical interconnection between printed circuit boards in electronic equipment contributes significantly to the price of the equipment. Thus, there has been widespread effort to increase the interconnection density of printed circuit boards and thus decrease their size and associated cost. In one configuration employed to increase interconnection density, printed circuit patterns are placed on both major surfaces of a substrate such as a glass reinforced epoxy substrate. Electrical interconnections between points in the two patterns are made by drilling through the substrate and metallizing the hole. This configuration significantly increases the capacity of one printed circuit board. However, the holes drilled for interconnection are large, e.g., approximately 0.015 to 0.045 inches. Since the holes are larger than the typical width of a pattern section, generally 0.005 to 0.015 inches, they extend beyond the limits of a pattern line. Adjacent pattern lines must be deflected to avoid short circuits with the enlarged metallized portion surrounding the interconnection hole. Thus, the holes occupy a significant area and therefore increase the size of the printed circuit. In addition, these holes necessitate an increased complexity in the design of the printed circuit board pattern.

Figure 1:
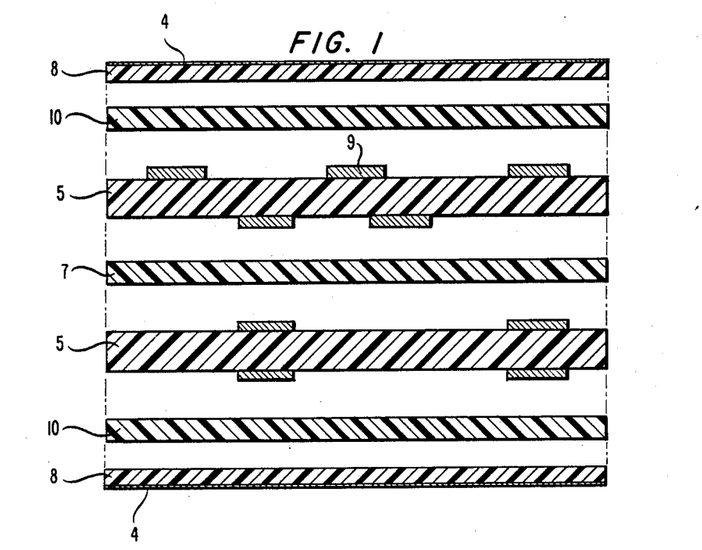
FIG. 1 and 2 represent methods of producing multilayer circuit boards.

Multiple level pattern configurations have also been employed to further increase the capacity of printed circuit boards. In one such configuration, printed circuit board patterns, 9, are formed on both major surfaces of two or more separate substrates (C-stages, 5, in FIG. 1). An adhesive bonding layer, for example, an epoxy impregnated glass cloth, (B-stage, 7, in FIG. 1), is sandwiched between two or more substrates each having their associated copper patterns on both major surfaces. The multilevel configuration is completed by sandwiching the two C-stages and the intermediate B-stage between external layers which include a copper foil, 4, and an additional C-stage layer, 8 with their associated B-stage, 10. The entire structure is pressed together at an elevated temperature. The pressure and elevated temperature cures the B-stage resin and produces a monolithic structure. By appropriately configuring the copper patterns on the outer copper foil layer and by appropriately aligning the resin-encapsulated inner pattern on each substrate, electrical interconnection between the patterns on different substrates is possible by drilling holes completely through the structure and metallizing the holes. However, there are significant difficulties associated with aligning the appropriate sections of the patterns on each substrate so that a suitable electrical interconnection is made. Additionally, in this multiple level configuration, electrical contact between patterns on the same substrate are made as described previously in the two-sided printed circuit board. Thus, the problems encountered with two-sided printed circuit boards, e.g., large holes producing increased size and pattern complexity are also inherent in this multiple level board. Further, since an interconnection hole is drilled through the entire structure an interconnection between two patterns induces a hole with its associated complications in all the circuit layers.

Figure 2:
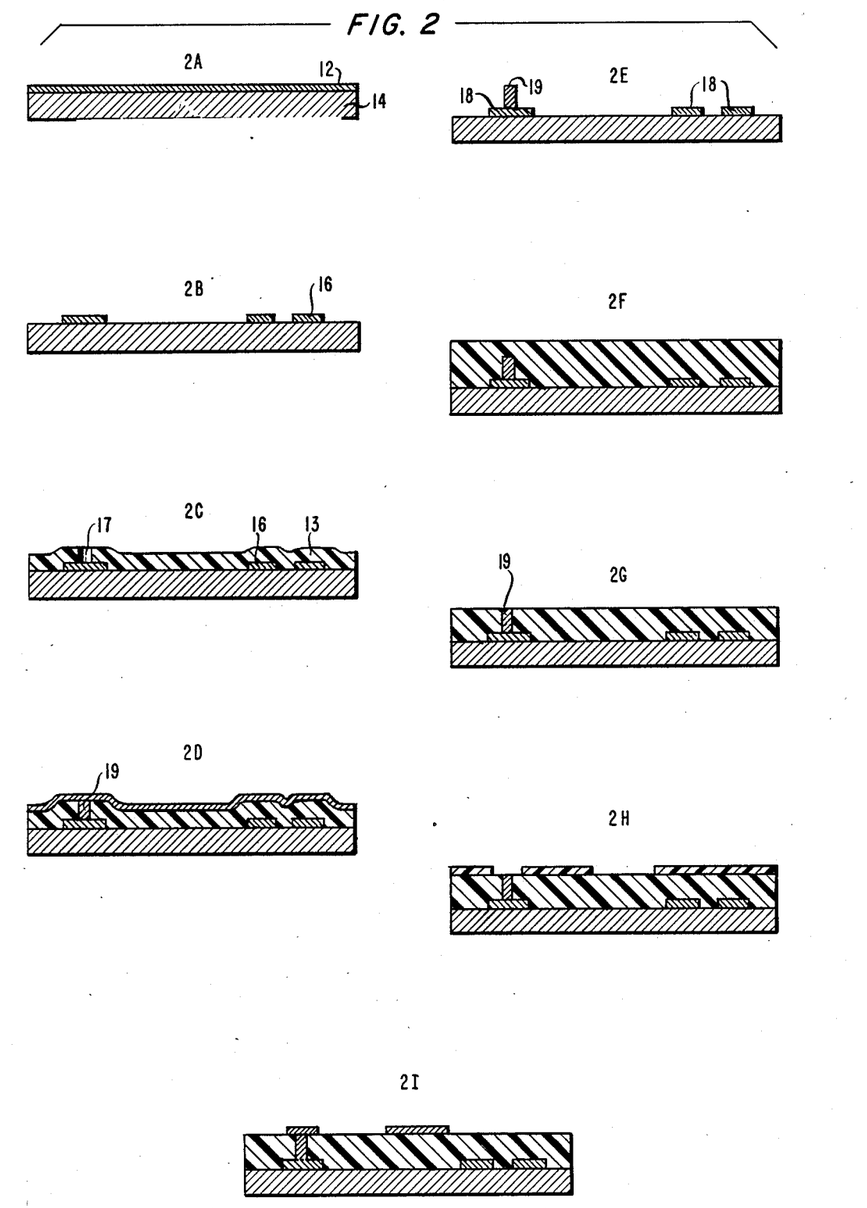

A multiple level circuit board has been developed that does not require the physical alignment of two independent substrates. In this process, as shown in FIG. 2, a copper layer, 12, is deposited on a stainless steel carrier, 14. A photoresist is applied to the copper layer and imaged in the desired pattern so that the copper areas of the underlying layer forming the desired pattern are covered and the remainder of the copper layer is exposed. The exposed copper is removed by etching and the photoresist is then removed leading to configuration 2B. A new photoresist layer is deposited and delineated so that holes, 17, in the resist, 13, are opened where connections between pattern levels are to be made. Copper is then evaporated onto the substrate over the resist and thus as a consequence, onto the exposed regions of the copper pattern leading to configuration, 2D. The photoresist is removed to leave the pattern, 18, with interconnection studs, 19 in configuration 2E. Polyimide resin is deposited onto the copper to yield configuration, 2F. The top of the polyimide is abraded to expose the copper structures, 19 in 2G. A photoresist is deposited onto the polyimide and suitably delineated to leave exposed areas of the polyimide where the second level copper pattern is to be formed leading to 2H. (This pattern includes the copper studs which are used as interconnection between the pattern levels.) A second copper layer is then deposited on the exposed polyimide and copper studs and the photoresist is removed leading to configuration 2I. The steps are repeated to produce successive patterned layers. That is, photolithography is again done by conventional techniques to delineate the desired interconnection openings, copper is evaporated onto the resist, the resist is removed, a second layer of polyimide is deposited, the surface of the polyimide is abraded to expose the copper, photolithography is employed to delineate the next pattern layer and copper is deposited onto the resist. As can be seen from FIG. 2 and the accompanying description, a large number of processing steps are involved. Thus, a high-density printed circuit board that is producible in a nominal number of steps is not yet available.

SUMMARY OF THE INVENTION

Figure 3:
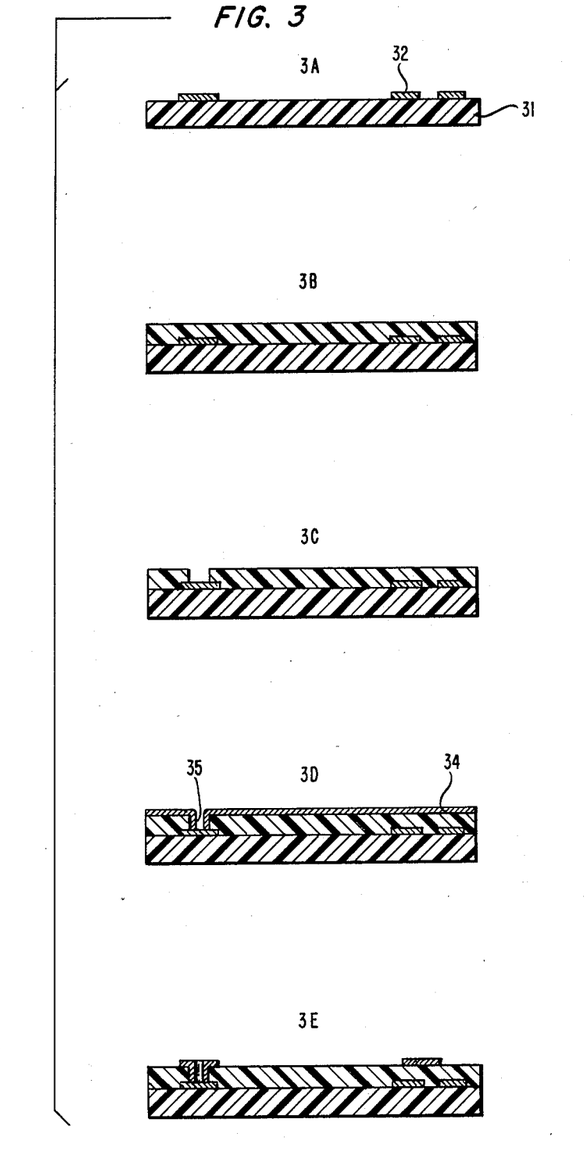
FIG. 3 and 4 illustrate the inventive process for producing multilayer printed circuit boards.

A process, as shown in FIG. 3, employing a specific set of fabrication steps allows the manufacture of high-density multiple level printed circuit boards in a relatively small number of steps. In one embodiment, the process is begun with a conventional substrate, 31, having a desired electrical conductor, e.g., copper, pattern, 32. An energy sensitive material, i.e., a material such as a polymer precursor, which upon exposure to appropriate electromagnetic radiation undergoes a modification, e.g., a chemical change such as cross-linking which in turn modifies the mechanical and/or chemical properties of the material, is deposited on the substrate with its conductor pattern yielding configuration 3B. After its deposition, the energy sensitive material is patterned as shown at 3C. In a preferred embodiment the energy sensitive material is then subjected to a blanket exposure of radiation, e.g., ultraviolet light, with an intensity significantly greater than that used for the initial delineation. This second exposure further completes the desired modification. A conductor, e.g., copper, is deposited directly onto the resulting patterned insulating material. The copper fills the voids in the energy sensitive material formed during the previous patterning steps and thus contacts the initial copper pattern. Additionally, the copper forms a layer on the energy sensitive material. Thus, in one step a copper layer, 34, is presented for production of a second suitable patterned copper layer and interconnection, 35, between copper layers is provided. The desired pattern is formed in the newly deposited copper layers through conventional photolithography leading to configuration 3E.

The energy sensitive, delineable material is carefully chosen so that after patterning an electrical conductor, e.g., copper, deposited upon it has sufficient adherence to produce a durable bond. By depositing an electrical conductor directly and permanently onto the surface of the irradiated photosensitive material a number of previously required processing steps are eliminated. Suitable energy sensitive materials are those formed from a combination of (1) an acrylated epoxy resin (2) a vinyl-terminated rubber, e.g., a copolymer of acrylonitrile and butadiene, which is, in turn, terminated with acrylic acid moieties and (3) a suitable viscosity reducer, e.g., a monomer such as isobornyl acrylate or a solvent such as ethylene glycol.

If desired, further pattern levels with the associated connection between levels are built by repeating the process, i.e., by sequentially depositing an appropriate energy sensitive material, delineating the material, if desired, blanket exposing the material, depositing the copper directly upon it and then forming the desired copper pattern. The use of the described processing steps in conjunction with an energy definable material to which copper adheres after patterning and, if used, blanket irradiation, yields a multiple level, high-density printed circuit board that is produced with a relatively small number of processing steps. It is possible for typical coating thicknesses to produce interconnection holes, i.e., vias, as small as 0.004 inches without drilling holes through the entire structure. Thus, the size and complexity of the circuit board is not unnecessarily increased.

It is possible to produce multilevel circuit configuration on both sides of the previously described two-sided circuit board or, for example, on circuit boards based on flexible substrates. Additionally, the energy definable material is useful after irradiation as a final protective coating for the completed circuit board.

DETAILED DESCRIPTION

The printed circuit boards of the subject invention are typically built on a substrate having on its surface a delineated electrical conductor, e.g., copper, pattern. (For pedagogic purposes, the remainder of the disclosure will be in terms of a copper electrical conductor. However, the invention is not confined to copper but is also applicable to other electrical conductors.) The substrate material employed and the method of producing the conductor pattern upon it is not critical. For example, a substrate composed of glassreinforced epoxy having a thickness generally in the range of 0.010 to 0.062 inches, a flexible circuit board, a ceramic, e.g., a 99 percent alumina material, or a circuit board having electrical conductor patterns on both major surfaces is utilized. The conductor pattern on the substrate is produced by conventional techniques, such as the subtractive, semiadditive, or fully additive deposition process. (The subtractive, semiadditive and fully additive processes are described in C. F. Coombs, Jr., *Printed Circuits Handbook*, Ed., McGraw Hill, 1979.)

Briefly, in the subtractive method a copper layer having a thickness of approximately 0.3 to 3 mils is bonded to the surface of the substrate by a hot press lamination process. A photoresist, such as Laminar ® LD dry-film photoresist, is then coated onto the copper layer. The photoresist is exposed and developed so that the areas of the copper that are to ultimately form the desired copper pattern remain covered. The portions of the copper layer that are not covered by the delineated photoresist are removed by etching leaving the desired copper pattern. After etching, the photoresist is solvated using materials such as methylene chloride.

Both the additive and the semiadditive techniques require the deposition of a conductor such as copper on an insulator, e.g., a typical substrate. When electroless deposition is employed, it is generally necessary to use specific adherence promoting steps. The steps are conventional and typically include treatment with a solvent such as dimethyl formamide to swell the insulating material and treatment with an acid, e.g., chromic acid to etch the insulating material. It is also possible to achieve the desired adherence by using deposition techniques such as evaporation or sputtering.

As discussed, the semiadditive process includes the steps of initially promoting adhesion by, for example, swelling and etching the surface of the substrate by treating it with a solvent such as dimethyl formamide to produce swelling and a treatment, such as chromic acid, to produce etching. A layer of a conductive material, such as copper, approximately 10 to 50 microinches thick, is then plated onto the substrate by electroless plating. (Electroless plating processes are fully described in literature references such as W. Goldie, *Metallic Coating of Plastics*, Electrochemical Publications (1968).) The deposited conductive material layer, e.g. the copper layer, is coated with a photoresist such as a Laminar ® LD dry-film photoresist (a proprietary product of Dynachem Company). The photoresist is patterned so that upon development only the areas of the copper plating which do not ultimately form the desired pattern are covered by the resist material. The thickness of the exposed copper portions is increased to a total thickness of approximately 0.0003 to 0.003 inches by conventional electroplating. Following plating, the photoresist is removed using a solvent such as methylene chloride. The entire copper surface is then exposed to an etchant such as ammonium persulfate for a period sufficient to remove the thin copper areas that were covered by the resist. (The thicker copper areas are somewhat thinned by this etching but still have a substantial thickness.) It is also possible before removing the delineated photoresist to deposit a thin layer (0.0001 to 0.0005 inches) of a tin-lead alloy. After the photoresist is removed and etching is begun, the tin entirely protects the underlying portions of the copper pattern.

The fully additive process, in a typical embodiment, involves first treating the substrate to promote adhesion by a process described previously. The treated substrate is then subjected to catalytic palladium. (See *Metallic Coating of Plastics*, supra.) A photoresist is employed to cover the substrate and exposed so that upon development the areas of the substrate where the copper pattern is to be deposited are uncovered. The delineated substrate is then subjected to an electroless copper plating bath for periods typically on the order of 18 hours to yield a copper pattern thickness of about 1 mil. (See *Metallic Coating of Plastics*, supra for a description of an electroless copper plating method suitable for this procedure.) The photoresist is then removed to yield the desired pattern on the substrate.

Irrespective of the method employed to produce the initial copper pattern, this pattern is subsequently covered with an energy sensitive material, to which, after patterning and upon appropriate processing, copper adheres. (Appropriate processing includes, for example, swelling and etching before the plating of a metal such as copper, through evaporative deposition, or through sputtering a metal such as copper, onto the energy sensitive material.) Additionally, in a preferred embodiment the energy sensitive material is chosen so that upon irradiation with appropriately chosen electromagnetic radiation, the material in the irradiated region is less susceptible to removal, e.g., solvation, than the unirradiated regions. (Alternatively, it is suitable to employ a material which is an electrical insulator which becomes more susceptible to removal in irradiated regions. Thus the openings, in the insulating material are produced in the irradiated regions. After the patterning, the material, if desired, is treated for example by heating to make the remaining portion more stable.) In the preferred embodiment materials which polymerize through cross-linking when irradiated are employed. Exemplary of appropriate photosensitive materials are those including (1) an acrylated epoxy resin, (2) a low molecular weight rubber, e.g., a butadieneacrylonitrile based rubber, that has been terminated with at least one energy sensitive, e.g., photosensitive, moiety such as an acrylic acid moiety, and (3) a viscosity lowering component, e.g., a monomer or solvent. (An energy sensitive moiety is one that will undergo a reaction under the influence of suitable energy.)

A variety of rubbers suitable for producing the desired rubber (composition (2)) are commercially available. Exemplary of suitable rubbers is a butadieneacrylonitrile rubber having a terminal acrylate group, e.g.,

(2A)

irradiation with appropriately chosen electromagnetic radiation, the material in the irradiated region is less susceptible to removal, e.g., solvation, than the unirradiated regions. (Alternatively, it is suitable to employ Examples of such materials that are available commercially are HYCAR® VTBN 1300X22 or VTBN 1300X23 sold by the B. F. Goodrich Company. Acrylated terminated rubbers having the structure are also useful. (Such materials are described in U.S. Pat. No. 3,892,819 which is hereby incorporated by reference.) Typically, the rubber should have a molecular weight in the range 2,000 to 20,000, preferably 3,000 to 10,000. (Materials with lower molecular weights tend to shrink excessively while materials with higher molecular weight are generally too viscous to be handled easily.) Additionally, in the case of an acrylonitrile/butadiene rubber, it is also desirable that the amount of acrylonitrile in the rubber be between 8 to 25 wt percent of the rubber. Higher or lower acrylonitrile content tends to produce materials which are less compatible with the epoxy composition (material (1)) and, thus although not precluded, generally are not desirable.

A variety of modified epoxy resins, i.e., epoxy acrylates, (compound (1)) are useful. Epoxy acrylates generally are prepared by reacting acrylic acid with an epoxy resin. Advantageous acrylated epoxy resins are those derived from bisphenol-A. A suitable compound is prepared by the reaction:

(where n is an integer). Examples of such epoxy acrylates are Celrad ® 3700 sold by Celanese Company, and Epocryl ® 370 which is sold by Shell Company. (For both products n=o.) The purpose of composition (1), i.e., the epoxy acrylate, is to produce thermal stability in the final composition. Thus, epoxy acrylates having a $T_g$ greater than 50 degrees C., preferably greater than 75 degrees C., should be employed. Epoxy acrylates are producible by reacting a phenol such as bisphenol-A with epichlorohydrin and reacting the resultant product with acrylic acid. Alternatively, epoxies produced by the reaction of bisphenol-F, with epichlorohydrin are suitable since they yield the desired $T_g$.

Both the rubber material and the epoxy material are relatively viscous. This viscosity makes handling and coating of the material on a substrate quite difficult. A variety of techniques are available for reducing the viscosity of the mixture formed from composition (1) and composition (2). The basic desire is to form a water-clear mixture that is not cloudy and that has a viscosity suitable for the method chosen to apply the mixture to the desired substrate. (For typical coating procedures such as curtain coating, roller coating, or screen printing, viscosities in the range 100 to 100,000 centipoise are desirable.) In the first technique, the composition (1) and composition (2) are cosolvated by a suitable solvent such as diethylene glycol monomethyl ether or diethylene glycol monoethyl ether acetate. If a solvent is employed, the solvent after coating is generally removed from the mixture by simply heating the mixture. However, the temperature used to remove the solvent should typically be less than 120 degrees C. to avoid initiating a reaction in the photosensitive material.

Another means for reducing viscosity involves the use of a monomer that reacts under the influence of electromagnetic radiation with composition (1) and composition (2). Generally, a low viscosity (less than 200 centipoise) reactive monomer (composition (3)) is added primarily to bring these materials together into one water-clear phase and to reduce the viscosity of the entire composition to a manageable level. Typically, to accomplish this purpose, the molecular weight of the monomer should be typically less than 500. Generally, if the monomer does not react with the remainder of the energy sensitive composition, the energy sensitive properties of the entire composition are severely degraded. For such reactivity, the monomer should have groups such as acrylate, acrylamide, or n-vinyl. The reactive groups are chosen so that they lead upon exposure to chain lengthening rather than cross-linking in the energy sensitive composition, i.e., they tend to extend the chain by linking the main backbone of the epoxy and rubber resins. If excessive cross-linking is initiated, it becomes difficult to promote adhesion to the material through swelling and etching. Monomers that satisfy these requirements include isobornyl acrylate (IBOA), hydroxyethyl acrylate (HEA), dicyclopentenyl oxyethyl acrylate (DOA), ethylhexyl acrylate (EHA), N-vinyl pyrollidone (NVP), and combinations of these monomers. (It should be noted that for certain applications a combination of solvent and monomer is useful for obtaining the desired viscosity. The exact combination for an advantageous viscosity is formulated by using a controlled sample.)

The energy sensitive material is prepared by physically mixing the rubber (compound 2) with the modified epoxy acrylate (compound 1) and with a suitable viscosity control component (3). Typically, the mixture should contain between 10 and 30 wt percent, preferably between 20 and 25 wt percent of compound 2, between 25 and 45 wt percent, preferably between 30 and 40 wt percent, of compound 1, and the remainder monomer (3). (If a solvent is used instead of monomer (3) or in addition to it, the amount of this solvent is not critical. Sufficient solvent should be used to maintain viscosity at the appropriate level required for the particular coating application technique.)

It is possible to include additives such as colorants to produce a desired color, or fillers (e.g. fumed silica) to enhance thixotropic properties, e.g., to yield a desired viscosity for applying the material to a substrate through screen printing. Additionally, a photoinitiator, such as benzoin ether, is added, if needed, to the mixture to initiate reaction in the areas exposed to actinic radiation. Conventional photoinitiators, such as benzoin ether, diethoxyacetophenone, or 2,2-dimethoxyphenylacetophenone are used to initiate the reaction in the acrylate photosensitive material and are added to the photosensitive material in a concentration of 1 to 5 wt percent.

Monomer (3) has an effect on the ultimate properties of the polymer. Although viscosity is the most significant of these properties, other properties are also affected. For example, to a lesser extent the electrical properties, i.e., the resistance, and the glass transition temperature are affected. A resistance greater than $2 \times 10^8$ ohm for surface resistance and $4 \times 10^8$ ohm/cm for volume resistivity when tested by the ASTM D257 test, for the processed energy sensitive material is typically desirable to electrically isolate the various copper pattern levels. Additionally, the viscosity of the energy sensitive material should not be so great that it is difficult to coat onto a substrate, i.e., viscosities in the range 100 to 100,000 centipoise are desirable for typical application techniques such as screen printing, roller coating or curtain coating. In this regard, as discussed previously, a suitable solvent or monomer should be employed to yield the desired viscosity for a particular application technique. (See *Coating and Laminating Machines* by H. L. Weiss, Coatings Technology Co. (1978) and *A Practical Guide to U. V. Curing in Screen Printing For Printed Circuits and the Graphic Arts*, Ed by S. G. Wentink and S. D. Koch, Technology Marketing Corp. (1981) for a description of such techniques.) When the ambient temperature is above $T_g$ adhesion of the photosensitive material to the underlying substrate is generally inadequate. Thus, for stability of the final product, the glass transition temperature should be above 50 degrees C., preferably above 75 degrees C. Although the epoxy chosen has the greatest effect on this property, generally monomers consistent with the desired $T_g$ for the photosensitive mixture should be employed.

A combination of suitable monomers are useful for producing properties not available by using a single monomer. For example, IBOA yields excellent resistivity but also leads to a higher viscosity than other monomers. Thus, for example, it is desirable to use a combination of IBOA with NVP to yield both quite desirable resistivity and viscosity.

Figure 4:
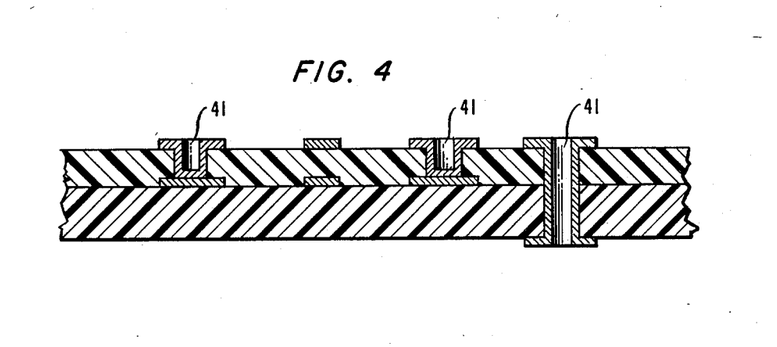

After the initial copper pattern is produced on the substrate, the energy sensitive material is coated onto it. Polymer thicknesses in the range 2 to 10 mils are typically employed. Thinner energy sensitive material layers lead to inadequate coverage and resistance, while thicker energy sensitive material layers typically produce inadequate resolution in the final pattern. The material is exposed by conventional techniques using actinic radiation in the desired pattern at a relatively low intensity level, e.g., 5 to 20 mW/cm$^2$ for periods in the range 15 seconds to 2 min. In the preferred embodiment, the exposure is done so that the regions in the energy sensitive material to be removed leaving an opening or via is not exposed. For example, the use of radiation in the wavelength range 250 to 350 nm for acrylate materials and their initiators yields upon development a configuration where the openings in the energy sensitive material leave uncovered areas in the underlying pattern to which interconnection between pattern layers are to be made. That is, as shown in FIG. 4, the interconnection, 41, is made through such openings. (For simplicity the initial substrate with its copper pattern is not shown in FIG. 4.) Since the attainable hole size is typically 1 to 2 times the thickness of the energy sensitive material layer, extremely small holes, as compared to conventional printed circuit board technology, are attainable. There is no necessity for drilling holes to produce this interconnection and additionally, interconnection between several layers need not be made in a straight vertical configuration. (Configurations such as shown in FIG. 4 are possible.)

To develop the energy sensitive material, through removal processes such as solvation, development solvents such as 1,1,1-trichloroethane, ethylene glycol, or diethylene glycol monobutyl ether are employed. After the photosensitive material has been exposed and developed, it is generally desirable to further promote the change, e.g., chemical reaction, begun by the initial exposure to yield an even more stable exposed material by a relatively highdose, blanket exposure to energy, e.g., employing ultraviolet light (250 to 350 nm), with a typical dose in the range 40 to 80 mW/cm$^2$ for a period of 30 seconds to 1 minute. Initial exposure with high doses of energy before development without a subsequent further blanket exposure although not precluded is typically undesirable since higher doses prevent the production of openings of approximately the same diameter as the thicknes of the photosensitive material. However, if suitable openings are attainable for a single exposure before development, then the use of subsequent blanket exposure is not essential provided the material is sufficiently electrically resistant without a second exposure.

Upon patterning and if desired blanket exposing the energy sensitive material, the surface and the openings, i.e., via holes, in the material are metallized by conventional techniques, e.g., swell and etch followed by electrolysis plating, vapor deposition or sputtering. A desired pattern is then produced on top of the cured resin in the copper layer by techniques such as the previously described fully additive and semiadditive deposition procedure. The process of energy sensitive material deposition, photodelineation and copper pattern production upon the deposited material is repeated until the desired number of layers are obtained.

The following examples are illustrative of the subject invention.

EXAMPLE 1

A standard copper-clad, glass reinforced epoxy substrate measuring 3 inches × 3 inches × 0.062 inches was treated with ammonium persulfate to remove the copper coating. The substrate was then rinsed in deionized water and dried. A photosensitive material was prepared for coating on the substrate. This material was prepared by first mixing into a common vessel 30 parts by weight of a modified epoxy of the formula of compound 1 supra where n=o, 20 parts by weight of a modified rubber of the formula shown supra as compound 2A (HYCAR® VTBN 1300X22), 40 parts by weight IBOA, 30 parts by weight ethoxylated bisphenol-A diacrylate as a second monomer, 1 part by weight 2,2-dimethoxyphenyl acetophenone, and 3 parts of a commercial pigment (No. 9R75 sold by Penn Color, Incorporated). The entire composition was heated to 60 degrees C. and mixed with a mechanical stirrer for 10 minutes. The resulting composition was placed in a vacuum (approximately 10 mm of mercury), to remove any air entrapped during stirring of the composition.

A bead of the mixture was placed along the entire length of one edge of the epoxy substrate. A three-quarter inch diameter, one-foot long threaded nylon rod having 40 threads per inch was employed to spread the bead of the mixture across the substrate. This rod was placed behind the bead and drawn over the bead across the entire length of the substrate. This procedure left a coating of the mixture on the substrate that had a thickness of approximately 5 mils.

A standard mylar mask having a pattern including circular openings of progressively larger diameter was employed to expose the photosensitive coating. This exposure was performed by employing an HTG, model number 312-10, light source manufactured by Hybrid Techology Group, Inc. The intensity level of light in the 365 nm region reaching the surface of the substrate was approximately 20 mW/cm$^2$. The exposure continued for approximately 15 seconds.

The substrate was suspended over a tank and was sprayed with diethylglycol monobutyl ether for approximately two and one-half minutes to develop the exposed substrate. (A Dupont model A, photoresist processor, was employed for this procedure.) The substrate was rinsed in water for approximately 30 seconds and dried in a forced-air oven at 100 degrees C. for 10 minutes. The substrate was then blanket cured using a 200 watt/inch high-pressure mercury vapor lamp light source positioned 6 inches from the substrate for an exposure time of approximately 15 seconds. This procedure yielded fully delineated holes as small as 6 mils in diameter.

EXAMPLE 2

The same procedure as in Example 1 was followed except the mylar mask employed had no pattern and was totally clear. Following the blanket cure, the coated substrate was immersed in a swelling mixture of 90 percent by weight dimethyl formamide and 10 percent by weight water at 35 degrees C. for 5 minutes. The substrate was then rinsed for approximately 5 seconds in deionized water. An etching solution was prepared by combining 56 percent by weight sulfuric acid, 10 percent phosphoric acid, 3 percent chromium trioxide and 31 percent water. The etching solution was heated to 60 degrees C., and the substrate was immersed in this heated solution for approximately 5 minutes. The substrate was again rinsed in deionized water for 5 seconds.

The substrate was metallized by first immersing it in a 1 N sodium hydroxide bath for 1 minute at 30 degrees C. to neutralize any residual acid from the etching bath. The substrate was then sequentially treated in a series of baths. The first bath employed was a 15 percent hydrochloric acid bath in which the substrate was immersed for 2 minutes at room temperature. The substrate was immersed in an activator (Enplate® Activator 443 manufactured by Enthone Company) for 5 minutes at room temperature, in a post-activator (Enplate® PA 491, a proprietary product of Enthone Company) for 10 minutes at room temperature and in an electroless copper plating solution (Enplate® CU404, a proprietary product of the Enthone Company) for 8 minutes at room temperature. The treatment resulted in a copper layer thickness of approximately 20 microinches. The thickness of the copper was then increased to 1.4 mils by electroplating the substrate using a Sel-Rex® CuBath M (a proprietary acidic copper sulfate plating bath of Oxy Metal Industries, Incorporated) at a current density of 25 Amps/ft$^2$ and a time of 50 minutes.

A one and one-half mil thick layer of Laminar LD dry-film photoresist was laminated onto the substrate with a hot-roll laminator. The photoresist was exposed through a mask that included a series of one-eight inch wide opaque regions separated by one-eighth inch wide transparent regions. Exposing radiation from an HTG model 312-10 light source with an intensity of approximately 20 mW/cm$^2$ at the photoresist surface was employed for approximately 15 seconds. The material was sprayed in a DuPont A resist processor with 1,1,1-trichloroethane for 30 seconds to develop the image. The copper that was uncovered by development was removed by etching with ammonium persulfate solution (10 percent) at a temperature of 30 degrees C. for 5 minutes. The photoresist was removed by immersing the substrate in methylene chloride for approximately 30 seconds. The substrate was placed in a forced air oven at 125 degrees C. for 1 hour.

The 90 degree peel strength of the copper strips was measured using a tensile strength pull tester. The tested peel strength was approximately 6 to 8 lb/in of width. (A desirable adhesion for printed circuit boards is generally accepted to be 5 lb/in or more.)

EXAMPLE 3

The procedures of Examples 1 and 2 were followed, except a photosensitive material having 50 parts by weight Celrad® 3702 which is a modification of compound 1 formed by reaction of the epoxy resin with a combination of predominately acrylic acid with some added diacid, 30 parts compound 2A (HYCAR® VTBN 1300X23) 50 parts IBOA, 1 part 2,2-dimethoxyphenyl acetophenone, 3 parts of the pigment used in Example 1 and 1 part of a flow control additive Modaflow® (Manufactured by Monsanto Industrial Chemical Company) was employed. This material exhibited hole sizes on the order of 6 mils and peel strengths of approximately 5 to 7 lb/in.

EXAMPLE 4

The procedures of Examples 1 and 2 were followed, except a photosensitive material having 20 parts by weight compound of formula (1) with n=3, 15 parts by weight compound of formula (1) with n=o, 25 parts compound of formula (2B), 40 parts of DOA, 2 parts 2,2-dimethoxyphenyl acetophenone, 3 parts of the pigment used in Example 1, and 1 part Modaflow®. Openings having a diameter of approximately 6 mils and peel strengths on the order of 6 to 8 lb/in of width and a T$_g$ of 58 degrees C. were obtained. The same procedure was followed except instead of 40 parts DOA, 30 parts IBOA and 10 parts NVP was employed. A peel strength of 4 to 6 lb/in and a T$_g$ of 100 degrees C. was obtained.

EXAMPLE 5

Figure 5:
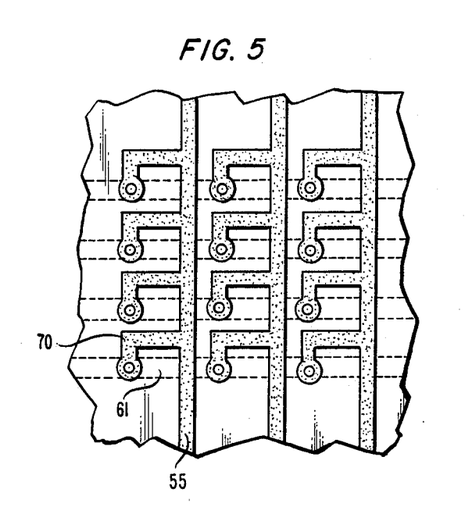
FIG. 5 and 6 illustrate one embodiment of the inventive process.
Figure 6:
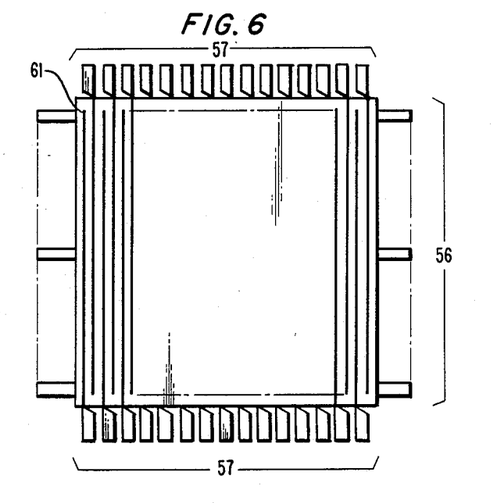

As illustrative of patterns producible by the inventive process, a procedure for connecting any desired vertical pad to any desired horizontal pad of an array for mounting an integrated circuit was performed. In this process, a substrate having a pattern of copper on its surface was prepared by employing the subtractive method as described earlier with a Laminar® LD dry-film photoresist, and an etchant of 10 percent aqueous ammonium persulfate applied for 5 minutes. The pattern produced in the copper by this subtractive procedure is shown in FIG. 6. To improve adhesion, the copper was treated with a hot (100 degrees C.) alkaline solution (Ebonol® C from Enthone Company) which produced a black oxide on the copper surface. The photosensitive material and initiator described in Example 1 were coated on this patterned substrate as described in Example 1 to a thickness of 5 mils. The exposure procedure of Example 1 was followed employing a mask pattern such that a series of holes were opened through to each copper line, 61 (in FIGS. 5 and 6), from the points corresponding to the intersection of (A) the lines 55 of copper ultimately to be produced and to connect to pads 56 with (B) the copper lines, 61. Additionally, holes were opened to pads, 56 and 57. The substrate was developed and blanket cured as described in Example 1. The substrate was immersed in 10 percent hydrochloric acid to dissolve the exposed black oxide. The substrate was then metallized and electroplated as described in Example 2. (The electroplating was continued until the entire thickness of the copper layer from the top surface of the photosensitive material was 100 microinches.)

A 1.5 mil thick layer of Laminar® LD dry-film photoresist was applied to the copper layer and exposed as described in Example 1 in a pattern to produce a series of lines, 55, with elbows, 70, in the resist emanating from the pads 56. (A magnification of a portion of three of these lines is shown in FIG. 5.) The photoresist was also developed as described in Example 1. The copper uncovered by the development of the photoresist was increased in thickness by electroplating at a current density of 25 amps/ft$^2$ to a thickness of 1 mil. The surface of the copper was then tin plated using a Shipley LT-27 immersion tin bath to protect the copper surface during subsequent etching steps. The photoresist was then stripped employing methylene chloride, and the copper was etched with a 10 percent by weight aqueous solution of ammonium per sulfate until the thin areas of the copper were removed. At this point in the procedure, all the pads, 56, are connected to all the pads, 57. To remove undesired connections the desired elbow, 70, in the second copper pattern is removed by etching.

What is claimed is:

1. A product comprising a first and second pattern of conductive material, an electrically insulating material interposed between said first and second pattern, and an electrical connection between said first and second pattern through said insulating material by a conductive via CHARACTERIZED IN THAT said conductive via and said insulating material is formed by subjecting an energy-sensitive material to electromagnetic radiation processing said energy-sensitive material to form said via and to produce said insulating material wherein said energy-sensitive material comprises an acrylated rubber, an acrylated epoxy having a glass transition temperature of at least 50 degrees C. that is capable of reacting with said acrylated rubber under the influence of said electromagnetic radiation and a viscosity modifier.

2. The product of claim 1 wherein said energy sensitive material comprises an acrylated rubber, an epoxy having a glass transition temperature of at least 50 degrees C. and a viscosity modifier.

3. The product of claim 2 wherein said viscosity modifier comprises a solvent.

4. The product of claim 2 wherein said viscosity modifier comprises a monomer.

5. The product of claim 4 wherein said monomer comprises a member of the group consisting of isobornyl acrylate, hydroxyethyl acrylate, dicyclopentenyl oxyethyl acrylate, ethylhexyl acrylate, and, n-vinyl pyrollidone.

6. The product of claim 1 wherein said acrylated rubber is an acrylated butadiene/acrylonitrile rubber.

7. The product of claim 1, 2 or 6 wherein said epoxy is formed from bisphenol-A.

8. A body comprising (1) a substrate, (2) at least one electrically conducting pattern overlying said substrate, and (3) an insulating material overlying said electrically conducting pattern CHARACTERIZED IN THAT said insulating material is formed from a material comprising an acrylated rubber, an acrylated epoxy having a glass transition temperature of at least 50 degrees C. and a viscosity modifier.

9. The body of claim 8 wherein said viscosity modifier comprises a solvent.

10. The body of claim 8 wherein said viscosity modifier comprises a monomer.

11. The body of claim 10 wherein said modifier comprises a member of the group consisting of isobornyl acrylate, hydroxyethyl acrylate, dicyclopentenyl oxyethyl acrylate, ethylhexyl acrylate, and N-vinyl prollidone.

12. The body of claim 8 wherein said acrylated rubber is an acrylated butadiene/acrylonitrile rubber.

13. The body of either claim 8, 9 or 12 wherein said epoxy is formed from bisphenol-A.

* * * * *